(12) United States Patent
Larisch (10) Patent No.: US 11,641,086 B2
(45) Date of Patent: May 2, 2023

(54) METHOD FOR AUTOMATICALLY MOUNTING A CONNECTOR-HOUSING

(71) Applicant: APTIV TECHNOLOGIES LIMITED, St. Michael (BB)

(72) Inventor: Markus Larisch, Wuppertal (DE)

(73) Assignee: APTIV TECHNOLOGIES LIMITED, St. Michael (BB)

( * ) Notice: Subject to any disclaimer, the term of this patent is extended or adjusted under 35 U.S.C. 154(b) by 298 days.

(21) Appl. No.: 17/068,289

(22) Filed: Oct. 12, 2020

(65) Prior Publication Data
US 2021/0028589 A1    Jan. 28, 2021

Related U.S. Application Data

(62) Division of application No. 15/318,704, filed as application No. PCT/EP2015/063350 on Jun. 15, 2015, now Pat. No. 10,804,667.

(30) Foreign Application Priority Data

Jun. 16, 2014   (EP) .................................... 14172588

(51) Int. Cl.
*H01R 43/20* (2006.01)
*H05K 13/04* (2006.01)
*H01R 43/28* (2006.01)
*H05K 13/08* (2006.01)

(52) U.S. Cl.
CPC ............. *H01R 43/20* (2013.01); *H01R 43/28* (2013.01); *H05K 13/041* (2018.08); *H05K 13/0409* (2018.08); *H05K 13/0812* (2018.08); *Y10T 29/49131* (2015.01); *Y10T 29/49133* (2015.01); *Y10T 29/49208* (2015.01); *Y10T 29/53209* (2015.01); *Y10T 29/53213* (2015.01)

(58) Field of Classification Search
CPC ...... H01R 43/28; H01R 43/20; H05K 13/041; H05K 13/0812; H05K 13/0409; Y10T 29/49208; Y10T 29/49139; Y10T 29/49131; Y10T 29/49133; Y10T 29/53209; Y10T 29/53213
See application file for complete search history.

(56) References Cited

U.S. PATENT DOCUMENTS 3,867,760 A  *  2/1975  Horecky ........... Y10T 29/49139
                                                   439/83
5,924,192 A  *  7/1999  Wuyts ............... Y10T 29/49139
                                                   29/721

FOREIGN PATENT DOCUMENTS

JP       2006202609 A  *  8/2006

OTHER PUBLICATIONS

Sargeant et al., "A 2-Axis Optical Force—Torque Fingertip Sensor for Dexterous Grasping Using Linear Polarizers," in IEEE Transactions on Instrumentation and Measurement, vol. 61, No. 12, pp. 3363-3377, Dec. 2012. (Year: 2012).*

* cited by examiner

*Primary Examiner* — A. Dexter Tugbang
(74) *Attorney, Agent, or Firm* — Billion & Armitage (57) ABSTRACT

A method for automatically mounting a connector housing with a contact part attached to an electrical line includes holding the contact part, determining an actual rotational position of the contact part, comparing the actual rotational position with a predetermined rotational position, and performing a rotational position correction thereby aligning the connector part to the connector housing. The connector housing is fixed to a holder and the contact part is inserted into a cavity of the connector housing by means of a movable gripper.

17 Claims, 7 Drawing Sheets

METHOD FOR AUTOMATICALLY MOUNTING A CONNECTOR-HOUSING

CROSS-REFERENCE TO RELATED APPLICATION

This application is a divisional application of co-pending U.S. application Ser. No. 15/318,704, filed Dec. 14, 2016, which claimed the benefit under 35 U.S.C. § 371 of published PCT Patent Application Number PCT/EP 2015/063350, filed 15 Jun. 2015, which claimed priority to European patent application number EP14172588.7 filed on 16 Jun. 2014, the entire contents of which is hereby incorporated by reference herein.

TECHNICAL FIELD OF INVENTION

This disclosure generally relates to a method for automatically mounting a connector housing having a contact part attached to an electrical line, wherein the connector housing is fixed to a holder and the contact part is inserted into a cavity of the connector housing by means of a movable gripper.

BACKGROUND OF INVENTION

The machine-based manufacturing of electrical line harnesses is often carried out with the use of robots or similar positioning devices that are equipped with grippers as end effectors. Usually, such a gripper holds a contact part either directly or at the electrical line, moves it to the desired cavity and inserts it therein. Such a mounting method is disclosed in EP 2461433 A1. The term "connector housing" is basically meant to be also a socket housing, a clamping bar, or the like. To ensure a reliable and efficient mounting process, an accurate knowledge of the positions of the respective components of the system is required.

For cost reasons, neither the connector housings nor the contact parts of conventional electrical lines can be manufactured with strict tolerance allowances. Accordingly, inaccuracies regarding the positioning arise repeatedly when using common mounting devices, whereby a reliable and efficient operation is made difficult.

SUMMARY OF THE INVENTION

In accordance with one embodiment, an alignment process is provided. The alignment process is carried out prior to insertion of a contact part into a cavity, comprising the steps of:
(i) holding the contact part, directly or at the electrical line, by means of an alignment gripper or another gripper,
(ii) determining an actual rotational position of the held contact part in relation to a rotation axis extending in parallel to an insertion direction,
(iii) comparing the determined actual rotational position with a rotational position predetermined by the characteristics and arrangement of the connector housing, and
(iv) performing a rotational position correction by means of the alignment gripper holding the contact part based on the result of the comparison.

The alignment process ensures that each provided contact part is in the correct rotational position before the insertion process. Thus, individual positional deviations can be compensated, and the process reliability can be increased. It is possible to bring radial form features of a contact part, such as crimping noses, flats, grooves, or the like, into the position predetermined by the form of the cavity. The reliability of the mounting process can be considerably increased by the automatic rotational position correction.

Preferably, determining the actual rotational position of the contact part in step (ii) is carried out by means of a camera directed onto the held contact part. In particular, the camera may be the camera with an associated image processing system. The use of the camera allows for a contact free and fast detection of the rotational position of a contact part.

Preferably, a lens of the camera is focused on a front-end face of the held contact part facing away from the electrical line. This ensures optimum recognition of radial form features or markings of the contact part in a captured image.

In another embodiment, the alignment process further comprises the step of: (v) performing a height position correction by means of the alignment gripper holding the contact part, if an actual height position of the held contact part, which indicates an axial position in relation to the rotation axis of a front side of the contact part facing away from the electrical line, deviates from a predetermined reference height position.

Deviations between the actual height position and the predetermined reference height position may occur due to tolerance related length differences of the individually provided contact parts. In the invention, it was recognized that such deviations often cause critical faulty positioning of contact parts in the associated cavities. Such faulty positions may be prevented by an automatic height position correction. The distance between the alignment gripper holding the contact part and the contact part tip is given by the protruding line length and the length of the contact part. These two lengths are in general procedurally known and can be considered accordingly, so that the distance between the alignment gripper and the contact part tip is always constant during a subsequent mounting process.

In yet another embodiment, the holding of the contact part in step (i) and the performing the rotational position correction in step (iv) is carried out by means of a rotatable alignment gripper, which is separated from the mounting gripper provided for insertion of the contact part into the cavity, wherein the contact part, after the rotational position correction in step (iv), is passed from the alignment gripper to the mounting gripper provided for insertion of the contact part into the cavity while avoiding a further twist. Due to the provision of a separate alignment gripper for the alignment process, the mounting gripper provided for mounting is not affected by the alignment process and therefore can execute successive mounting operations without any delay. Thus, the efficiency of the entire system is not affected by the alignment process.

Preferably, the insertion of the contact part into the cavity and the alignment process are carried out in spatially separated stations of a common mounting device to ensure an efficient overall process.

While performing the alignment process at the alignment station, a previously aligned contact part can be inserted into a cavity of a connector housing at the mounting station. The throughput of a mounting system can thereby be increased.

Another embodiment of the invention provides that, while performing the alignment process, another subsequently to be aligned contact part attached to an electrical line is taken from a contact part supply by a movable supply gripper and is placed into a supply position. Thus, the overall process can be further accelerated since the supply gripper can provide the contact part already prepositioned for the alignment process.

According to a specific embodiment of the invention, at least two contact parts are held at the same time in step (i) by means of a multigripper, which in step (iv) are subjected to a common rotational position correction by the multigripper. A double gripper can be provided. Such a double gripper enables an especially fast mounting process, particularly in the case where an electrical line with contact parts attached at both ends for connecting two connector housings is to be mounted.

In yet another embodiment, a device for automatically mounting a connector housing with a contact part attached to an electrical line, comprising a holder for fixing the connector housing and a movable gripper for inserting the contact part into a cavity of the connector housing. To achieve the above object, a mounting device according to the invention comprises an alignment station, comprising:

(i) at least one alignment gripper, which is configured for holding the contact part, directly or on the electric line, and rotating the held contact part about a rotation axis parallel to an insertion direction;

(ii) a camera for determining an actual rotational position of the contact part held by the alignment gripper in relation to the rotation axis; and (iii) a control device which is configured for comparing the determined actual rotational position with a rotational position predetermined by the characteristics and arrangement of the connector housing and for controlling the alignment gripper so that it performs a corrective rotational movement based on the result of the comparison.

By providing an alignment station with an alignment gripper and a camera, the process reliability in an automatic mounting device can be increased and the efficiency can be improved. In particular, the alignment station can be procedurally arranged upstream from a mounting station.

Preferably, the alignment gripper is provided in addition to the mounting gripper provided for insertion of the contact part into the cavity. Thus, the mounting gripper provided for mounting is not affected by the rotational position correction.

The alignment gripper may be configured for rotating the held contact part by at least 90°, preferably at least 180°. This allows for a rotational position correction even with comparatively large misalignments or from any initial positions. A rotation of the gripper in such a wide rotation angle range facilitates the positioning of individual radial form features of the contact part, such as crimping noses, flats, grooves, and the like.

In yet another embodiment, the alignment gripper is displaceable along the rotation axis and/or perpendicular to the rotation axis, preferably by means of a linear positioning system. In this way, the correction possibilities during the alignment process can be extended. The benefit of a linear positioning system compared to a robot is that no mathematical model related nonlinearities occur.

According to a specific embodiment, the alignment gripper is configured for common holding and rotating of at least two contact parts, wherein each of the held contact parts has its own associated camera. Multigrippers allow for particularly fast mounting operations.

Preferably, the camera is arranged such that it is directed from a side facing away from the electrical line to the contact part held by the alignment gripper. The actual rotational position of the contact part is easily detectable from such a point of view.

In yet another embodiment, a mounting camera is provided for determining the position of the connector housing in relation to a predetermined reference position, wherein the movable mounting gripper and the mounting camera form a mounting unit configured for common movement. In other words, a mounting unit with its own camera can be provided, so no measuring station including associated drives is necessary. Between the mounting camera image and the tip of the contact part at the mounting gripper, there is a fixed geometric relationship due to the common mobility. This results in a high degree of flexibility in relation to different mountings of a specific panel with connector housings. The benefits of a mounting unit with its own mounting camera are provided independently of the presence of an alignment station, so for this aspect also independent protection is claimed.

Further features and advantages will appear more clearly on a reading of the following detailed description of the preferred embodiment, which is given by way of non-limiting example only and with reference to the accompanying drawings.

BRIEF DESCRIPTION OF DRAWINGS

The present invention will now be described, by way of example with reference to the accompanying drawings, in which.

DETAILED DESCRIPTION

The mounting device illustrated in simplified form in the FIGS. 1 to 7 includes a supply station 10, an alignment station 12 and a mounting station 14, which are arranged spatially separated, here in direct succession. A stationary fixable holder 16 for a plurality of connector housings 18 is provided in the area of the mounting station 14. In particular, the connector housings 18 can be locked in receptacles of the panel like holder 16, optionally using additional holders. The connector housings 18 exemplified in different configurations each comprise several cavities 19.

Figure 1:
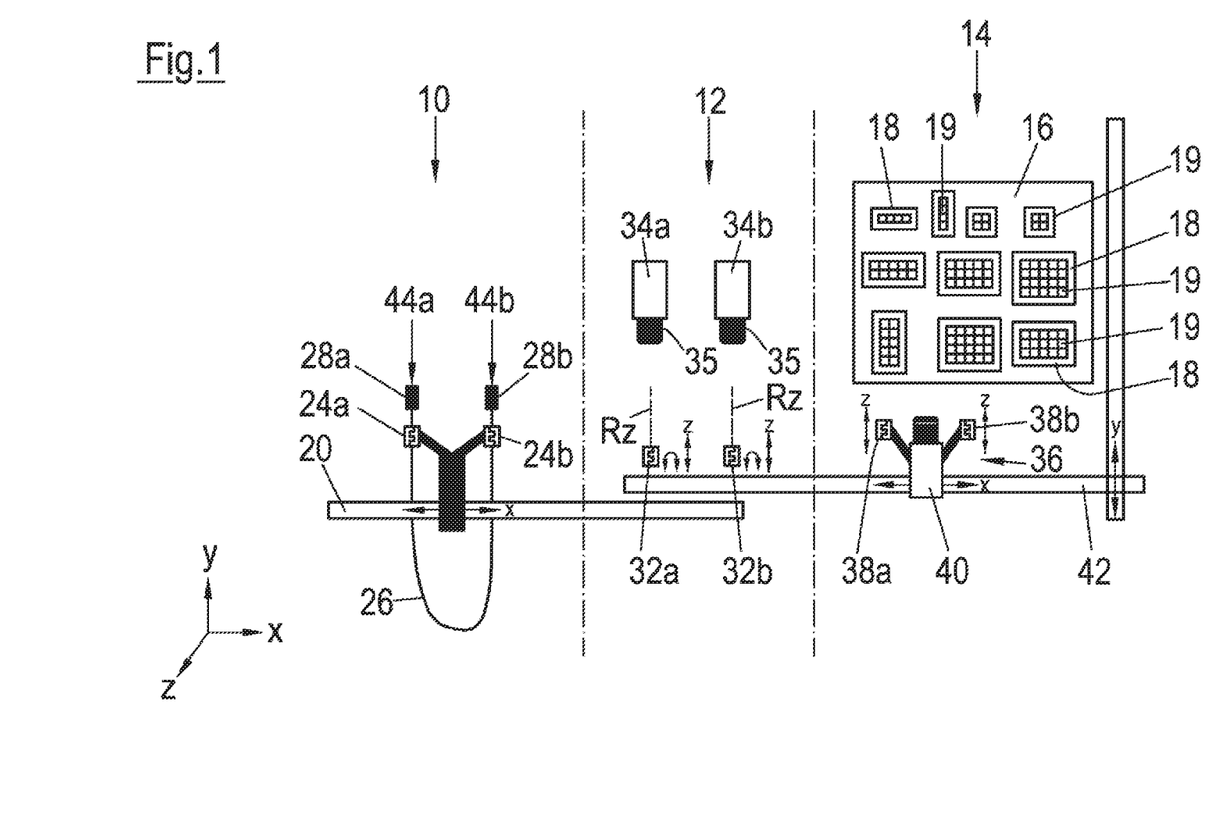
FIG. 1 is a simplified representation of a mounting device during provision of an electrical line including two contact parts attached thereto in accordance with one embodiment.

A first positioning system 20, here in the form of a uniaxial linear system, is associated with the supply station 10 and is used to move two adjacent supply grippers 24a, 24b which are combined into a double gripper. In FIG. 1 an electrical line 26 is recognizable in the area of the supply station 10, which is provided at both ends with respective contact parts 28a, 28b. Each of the contact parts 28a, 28b is held at the electrical line 26 by one of the supply grippers 24a, 24b. The supply grippers 24a, 24b could also be configured for directly holding the contact parts 28a, 28b.

Two adjacent alignment grippers 32a, 32b are provided in the area of the alignment station 12, which may also be combined into a double gripper dependent on the application. The alignment grippers 32a, 32b may be similar in principle as the supply grippers 24a, 24b. As shown by the curved double arrows, the alignment grippers 32a, 32b are each configured to be rotatable for rotating a held contact part 28a, 28b about a rotation axis Rz, preferably by 180°. In addition, the alignment grippers 32a, 32b are each linearly displaceable along the rotation axis Rz, as indicated by the straight double arrows. Two alignment cameras 34a, 34b including respective image processing systems, not shown, are arranged in the area of the alignment station 12 and are directed to a respective one of the alignment grippers 32a, 32b. The alignment cameras 34a, 34b may also be connected to a common image processing system.

A mounting unit 36 associated with the mounting station 14 includes two mounting grippers 38a, 38b and a mounting camera 40 with associated own or higher-level image processing system. By means of a second positioning system 42, which is configured as a two-axis linear system, as shown, the mounting unit 36 can be moved in front of the individual connector-housings 18 fixed to the holder 16. As shown, the first-positioning system 20 and the second positioning system 42 overlap with each other in the area of the alignment station 12, so that a transfer of held contact parts 28a, 28b between the individual grippers is possible.

For reasons of clarity, in all figures the holder 16 with the fixed connector housings 18 and the second positioning system 42 are depicted in a front view, while the other components of the mounting device are shown in a plan view.

Figure 2:
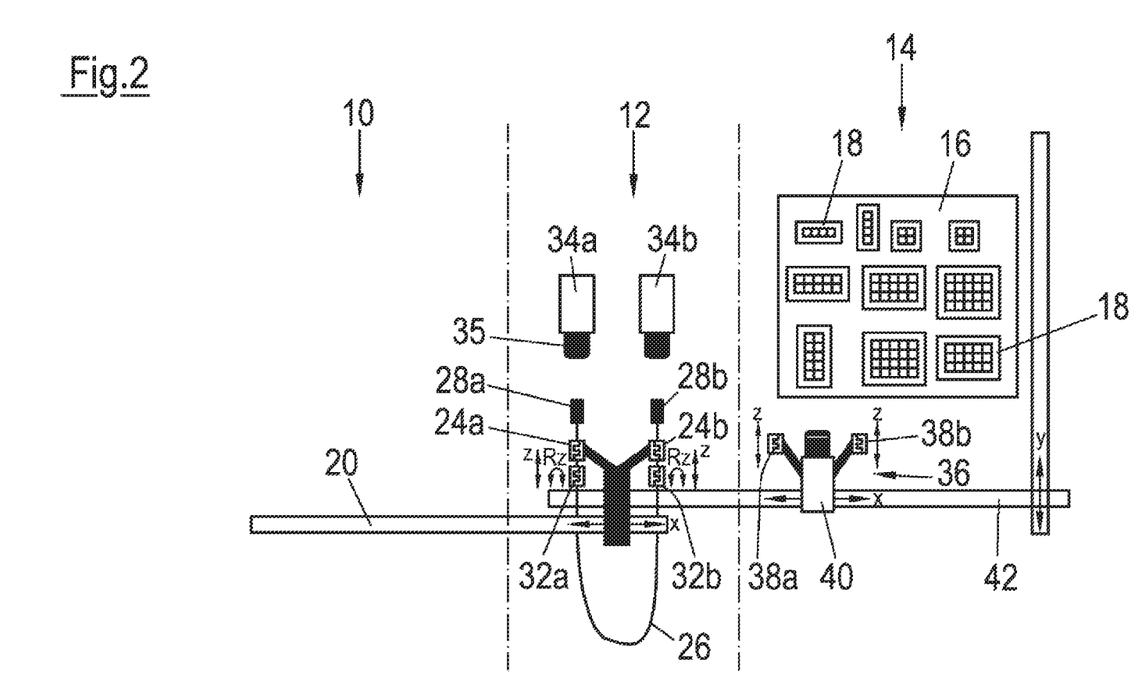
FIG. 2 depicts the mounting device of FIG. 1 during the transfer of the electrical line to an alignment station in accordance with one embodiment.

During normal operation of the mounting device, a prefabricated electrical line 26 with two contact parts 28a, 28b attached to ends is taken from a component supply, not shown, and, as shown in FIG. 1, is brought into a provisioning position by means of the supply grippers 24a, 24b. In doing so, crimping noses of the contact parts 28a, 28b can always point upwards, for example. The contact parts 28a, 28b are then moved to the alignment station 12 by means of the first positioning system 20 and transferred to the alignment grippers 32a, 32b. This transfer is shown in FIG. 2. After the transfer, the supply grippers 24a, 24b are moved back to their original positions, and it is immediately started with the provision of another electrical line 26.

Figure 3:
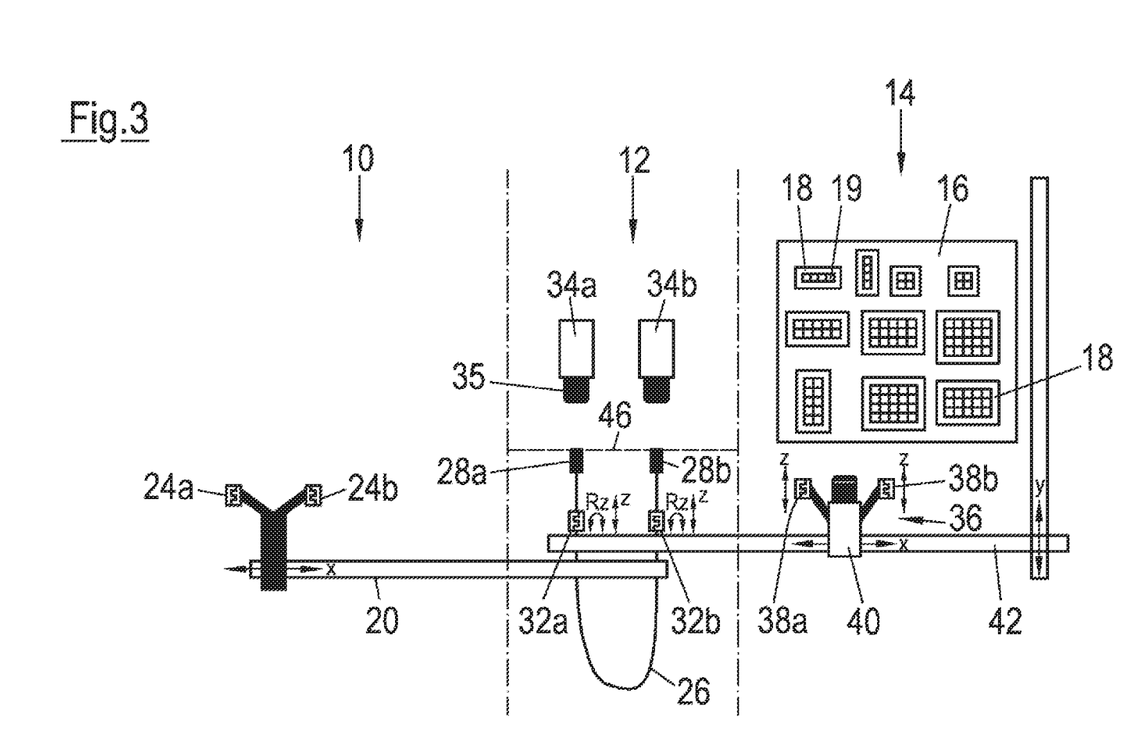
FIG. 3 depicts the mounting device of FIG. 1 during an alignment process in accordance with one embodiment.

The alignment grippers 32a, 32b perform an alignment process by initially determining an actual rotational position of the held contact parts 28a, 28b in relation to the respective rotation axis Rz by means of the alignment cameras 34a, 34b and the associated image processing systems. The lenses 35 of the alignment cameras 34a, 34b are each focused on the front-end faces 44a, 44b (FIG. 1) of the held contact parts 28a, 28b. Subsequently, the determined actual rotational position is compared to a rotational position predetermined by the characteristics and arrangement of the connector housing 18 to be mounted. Based on the result of the comparison, a rotational position correction is performed by appropriately rotating the alignment grippers 32a, 32b. In addition, the two contact parts 28a, 28b are displaced along the respective rotation axis Rz by means of the alignment grippers 32a, 32b, as necessary, so that the front end faces 44a, 44b of the contact parts 28a, 28b are on a common reference line 46 extending perpendicular to the rotation axes Rz (FIG. 3).

Figure 4:
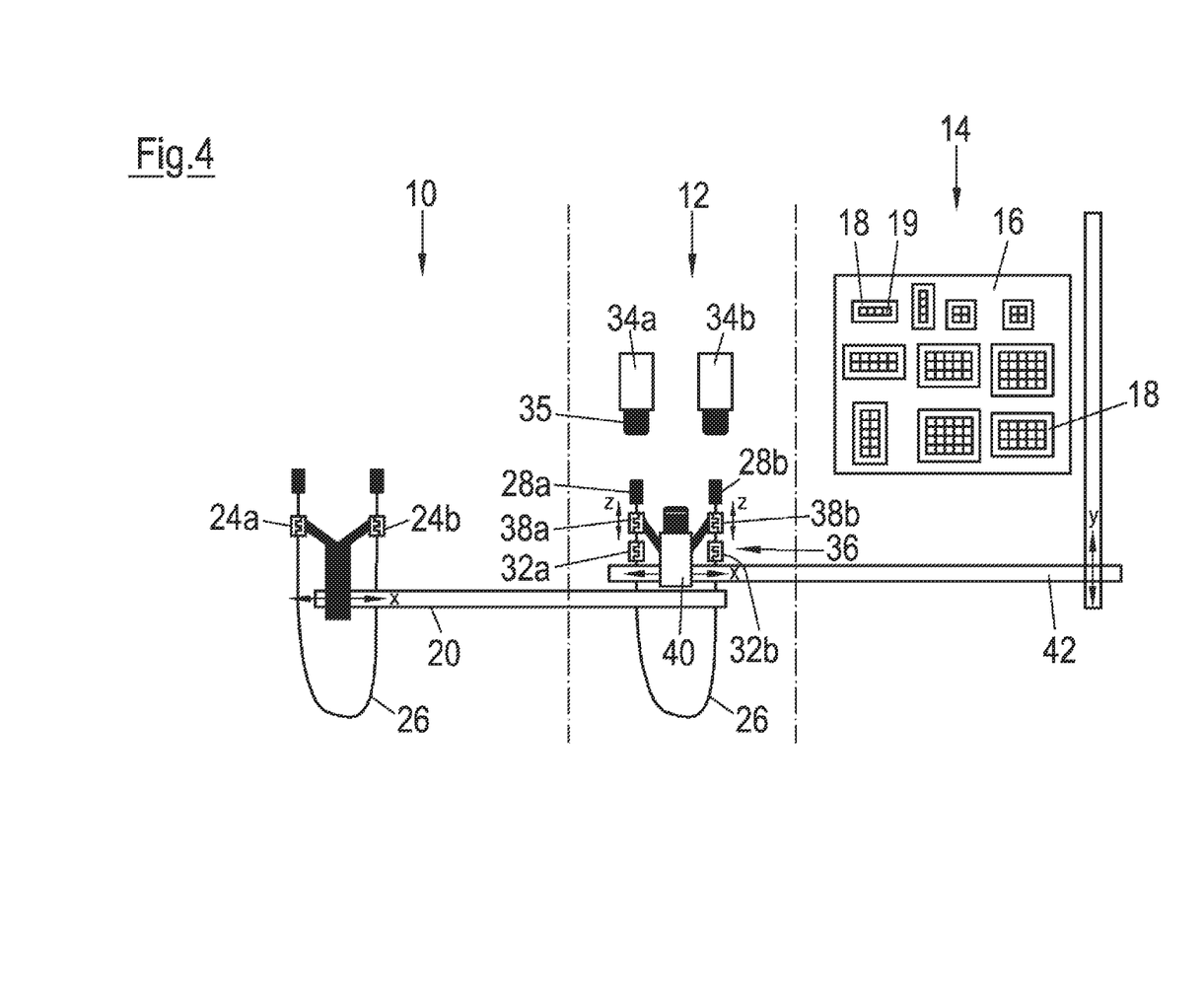
FIG. 4 depicts the mounting device of FIG. 1 during the transfer of the electrical line to a mounting station in accordance with one embodiment.

The mounting unit 36 is subsequently or even during the alignment process moved to the alignment station 12. There, the two ends of the electrical line 26 with the contact parts 28a, 28b are transferred from the alignment grippers 32a, 32b to the mounting grippers 38a, 38b, as shown in FIG. 4. The transfer is carried out, while avoiding a rotation of the contact parts 28a, 28b. With the use of the alignment cameras 34a, 34b, potential deviations of the positions of the contact parts 28a, 28b are determined in an x-y plane perpendicular to the rotational axes Rz in relation to the respective reference positions.

Figure 5:
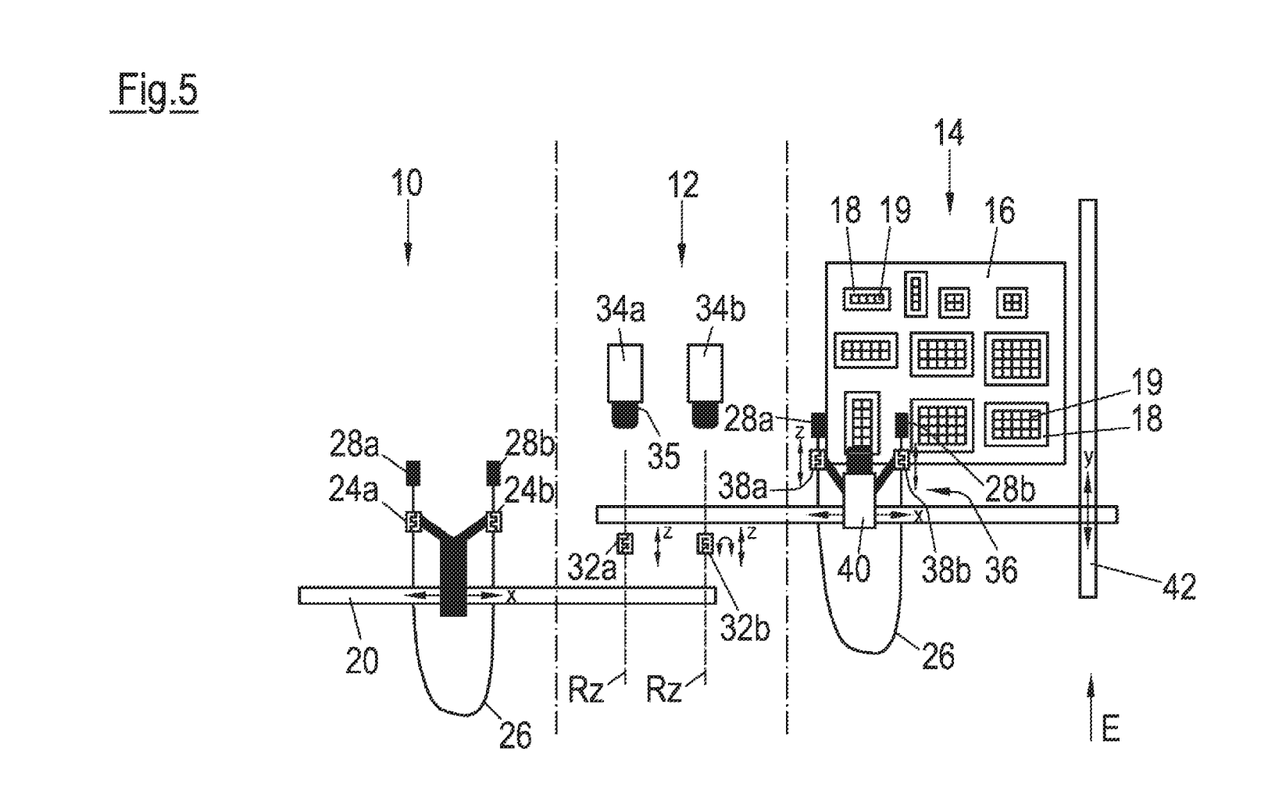
FIG. 5 depicts the mounting device of FIG. 1 prior to insertion of the contact parts into respective cavities of connector housings in accordance with one embodiment.

The mounting unit 36 is then positioned together with the electrical line 26 by means of the second positioning system 42 in the x y plane in front of the desired connector housing 18 (FIG. 5). The mounting camera 40 of the mounting unit 36 determines the exact position, including any minor rotations of the respective connector housing 18 in relation to a predetermined reference position associated with the mounting camera 40. The determined position deviations and rotations are temporarily stored in a control device, not shown, and used for mounting operations on other cavities 19 of the respective connector housing 18. The positions of the cavities 19 of a given connector housing 18 in relation to a reference position are taken from a higher-level database.

Figure 6:
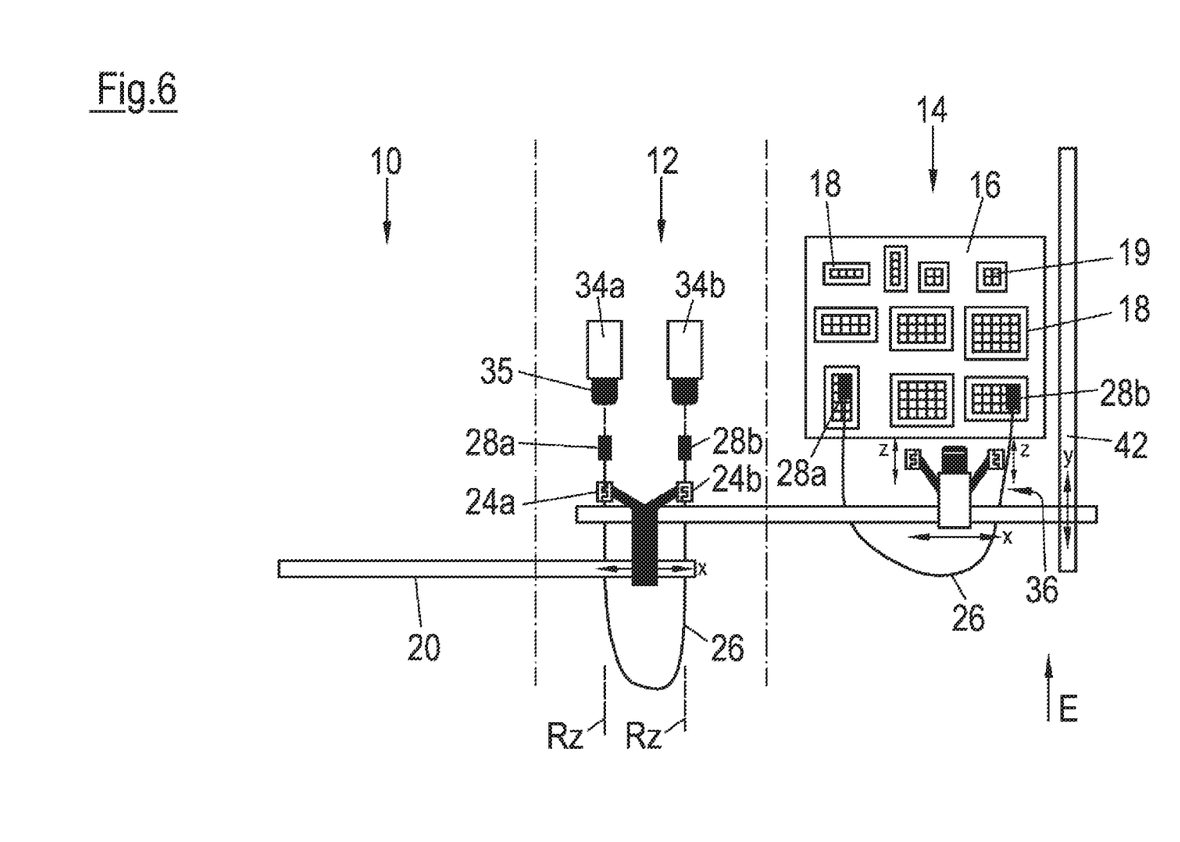
FIG. 6 depicts the mounting device of FIG. 1 after insertion of the contact parts into the cavities in accordance with one embodiment.

Due to a calibration of the mounting device performed before starting operation, to be described in more detail below, the exact positions of the tips of the contact parts 28a, 28b in relation to the reference position of the mounting camera 40 are known. The mounting unit 36 is now positioned in the x y plane by the second positioning system 42 so that the contact part 28a located to the left in the image is arranged in front of the cavity 19 to be mounted. By movement of the associated mounting gripper 38a in an insertion direction E, the contact part 28a is inserted into the cavity 19 and optionally locked thereto. The same process is repeated with the other contact part 28b and the cavity 19 corresponding thereto, so that the state shown in FIG. 6 is created. As illustrated in FIGS. 5 and 6, the insertion direction E is parallel to the rotation axes Rz.

For the various connector housings 18 which are fixed to the holder 16, the position of the connector housing 18 is captured by the mounting camera 40 only at the first contact part 28a, 28b, respectively. For all other contact parts 28a, 28b for the respective connector housing 18, the temporarily stored position data are used.

During the mounting process, a further electrical line 26 with attached contact parts 28a, 28b is provided by means of the supply grippers 24a, 24b and transported to the alignment station 12 and the process begins again. If necessary, it is possible to use only a single alignment gripper 32a and only one alignment camera 34a at the alignment station 12.

Figure 7:
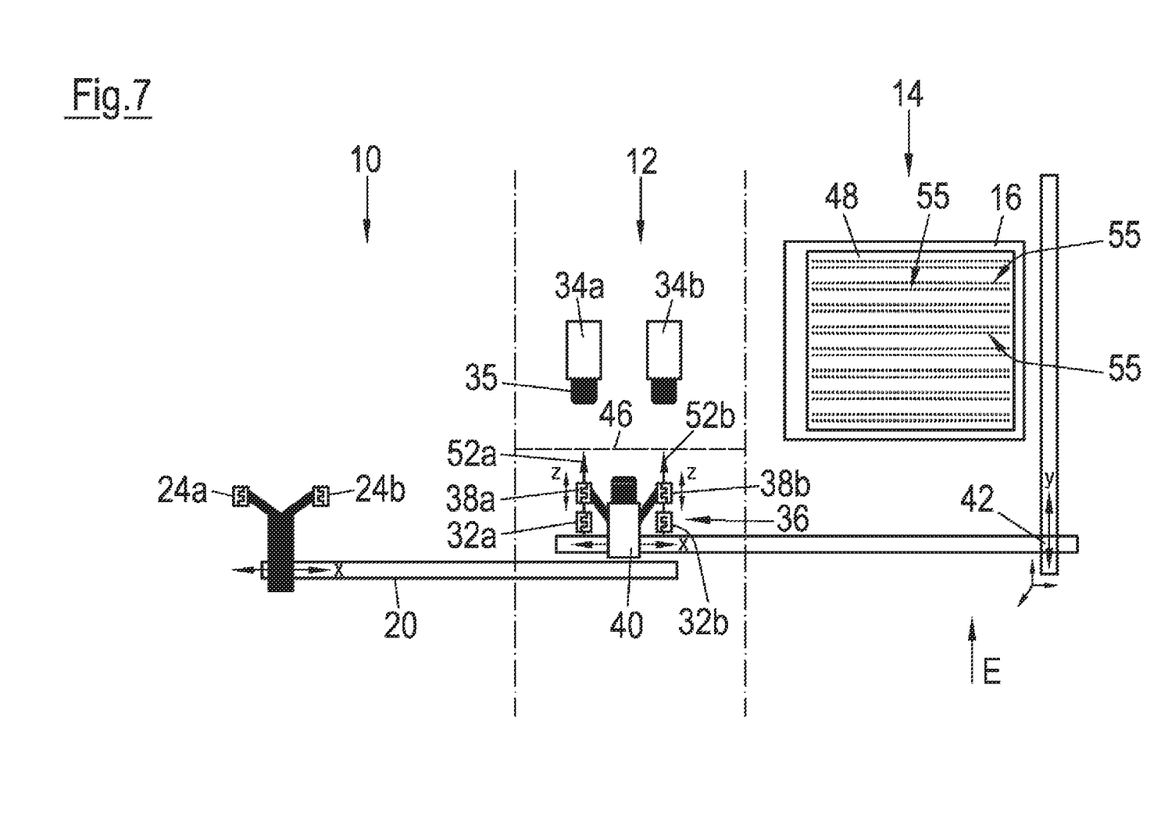
FIG. 7 depicts the mounting device of FIG. 1 during a calibration process in accordance with one embodiment.

FIG. 7 illustrates a calibration method for the mounting device according to the invention, which is carried out using a marking carrier 48 and two 52a, 52b. As part of this calibration method, first the marking carrier 48, which may be for example a paper or foil element, is attached to the holder 16. Respective marking devices 52a, 52b instead of ends of the electrical line 26 are gripped by the mounting grippers 38a, 38b. The marking devices 52a, 52b are generally shown as arrows in FIG. 7 and, in practice, may be configured as pins, needles, laser heads or thermal elements, for example. The first mounting gripper 38a is moved along a horizontal line. In a uniform distance of 10 mm, for example, the movement is respectively stopped and the mounting gripper 38a is moved in the insertion direction E towards the marking carrier 48 until the tip of the marking device 52a contacts therewith and thus sets a marking point 55. Subsequently, another row of marking points 55 is created with altered Y position. The row by row setting of marking points 55 is repeated until the entire marking carrier 48 is covered by a grid like array of points, as shown.

After the setting of all marking points 55, the mounting camera 40 of the mounting unit 36 is successively moved to the individual marking points 55 by the second positioning system 42 and the positions of the marking points 55 on the marking carrier 48 are determined by the displacement position of the second positioning system 42 and the position of the marking point 55 in the captured image. The thus determined positions of the marking points 55 are stored together with the displacement coordinates of the second positioning system 42 in a storage device. Subsequently, the calibration method is repeated with the second mounting gripper 38b and its associated marking device 52b.

During a subsequent normal operation of the mounting device, the respective displacement coordinates of the second positioning system 42 can be determined from the positions of the connector housings 18 at the holder 16 using the stored data. Here, intermediate values can be determined by suitable mathematical methods, for example by an interpolation method. Any deviations from an orthogonal and linear movement of the mounting unit 36, which for example lead to a trapezoidal, cushion like or barrel like distortion of the grid like array of points, are determined by the calibration file and can be compensated accordingly in terms of control.

Overall, the invention enables a particularly reliable and fast mounting of connector housings 18 with electrical lines 26.

Accordingly, a device and method for mounting a connector housing is provided. The alignment process ensures that each provided contact part is in the correct rotational position before the insertion process. The reliability of the mounting process can be considerably increased by the automatic rotational position correction.

While this invention has been described in terms of the preferred embodiments thereof, it is not intended to be so limited, but rather only to the extent set forth in the claims that follow.

The invention claimed is:

1. A method for automatically mounting a connector housing having a contact part attached to an electrical line, wherein the connector housing is fixed to a holder and the contact part is inserted into a cavity of the connector housing by means of a movable mounting gripper, the method comprising:
   holding the contact part using an alignment gripper,
   determining, with a camera and an image processing system, an actual rotational position of the contact part in relation to a rotation axis extending in parallel to an insertion direction,
   comparing, using a control device, the actual rotational position with a predetermined rotational position based on characteristics and arrangement of the connector housing, the connector housing defining the cavity;
   performing a rotational position correction, using the alignment gripper based on the result of the comparison, thereby aligning the contact part to the connector housing prior to inserting the contact part into the cavity; and
   holding the contact part and performing the rotational position correction using a rotatable alignment gripper which is separated from the moveable mounting gripper used for inserting the contact part into the cavity.

2. The method according to claim 1, further comprising focusing a lens of the camera on a front-end face of the contact part, the front-end face facing away from the electrical line.

3. The method according to claim 2, further comprising performing a height position correction to the alignment gripper when an actual height position of the contact part deviates from a predetermined reference height position, wherein the actual height position is defined as an axial position in relation to the rotation axis of the front-end face of the contact part.

4. The method according to claim 1, wherein the contact part, after performing the rotational position correction is passed from the alignment gripper to the mounting gripper while avoiding a further twist.

5. The method according to claim 1, wherein the actual rotational position of the contact part is determined as the alignment gripper rotates the contact part about the rotation axis.

6. A method for automatically mounting a connector housing having a contact part attached to an electrical line, wherein the connector housing is fixed to a holder and the contact part is inserted into a cavity of the connector housing by means of a movable mounting gripper, the method comprising:
   holding the contact part using an alignment gripper,
   determining, with a camera and an image processing system, an actual rotational position of the contact part in relation to a rotation axis extending in parallel to an insertion direction,
   comparing, using a control device, the actual rotational position with a predetermined rotational position based on characteristics and arrangement of the connector housing, the connector housing defining the cavity;
   performing a rotational position correction, using the alignment gripper based on the result of the comparison, thereby aligning the contact part to the connector housing prior to inserting the contact part into the cavity; and
   inserting a previously aligned contact part into the cavity of the connector housing at a mounting station while performing an alignment process at an alignment station, the mounting station and the alignment station spatially separated in a mounting device.

7. The method according to claim 6, further comprising focusing a lens of the camera on a front-end face of the contact part, the front-end face facing away from the electrical line.

8. The method according to claim 7, further comprising performing a height position correction to the alignment gripper when an actual height position of the contact part deviates from a predetermined reference height position, wherein the actual height position is defined as an axial position in relation to the rotation axis of the front-end face of the contact part.

9. The method according to claim 6, wherein the actual rotational position of the contact part is determined as the alignment gripper rotates the contact part about the rotation axis.

10. A method for automatically mounting a connector housing having a contact part attached to an electrical line, wherein the connector housing is fixed to a holder and the contact part is inserted into a cavity of the connector housing by means of a movable mounting gripper, the method comprising:
   holding the contact part using an alignment gripper,
   determining, with a camera and an image processing system, an actual rotational position of the contact part in relation to a rotation axis extending in parallel to an insertion direction, comparing, using a control device, the actual rotational position with a predetermined rotational position based on characteristics and arrangement of the connector housing, the connector housing defining the cavity;

performing a rotational position correction, using the alignment gripper based on the result of the comparison, thereby aligning the contact part to the connector housing prior to inserting the contact part into the cavity; and placing another contact part attached to the electrical line into a supply station, the another contact part taken from a contact part supply by a movable supply gripper while performing the alignment process.

11. The method according to claim 10, further comprising focusing a lens of the camera on a front-end face of the contact part, the front-end face facing away from the electrical line.

12. The method according to claim 11, further comprising performing a height position correction to the alignment gripper when an actual height position of the contact part deviates from a predetermined reference height position, wherein the actual height position is defined as an axial position in relation to the rotation axis of the front-end face of the contact part.

13. The method according to claim 10, wherein the actual rotational position of the contact part is determined as the alignment gripper rotates the contact part about the rotation axis.

14. A method for automatically mounting a connector housing having a contact part attached to an electrical line, wherein the connector housing is fixed to a holder and the contact part is inserted into a cavity of the connector housing by means of a movable mounting gripper, the method comprising:

holding the contact part using an alignment gripper, determining, with a camera and an image processing system, an actual rotational position of the contact part in relation to a rotation axis extending in parallel to an insertion direction, comparing, using a control device, the actual rotational position with a predetermined rotational position based on characteristics and arrangement of the connector housing, the connector housing defining the cavity;

performing a rotational position correction, using the alignment gripper based on the result of the comparison, thereby aligning the contact part to the connector housing prior to inserting the contact part into the cavity; and holding two contact parts using a multigripper, wherein the two contact parts are subjected to a common rotational position correction using the multigripper.

15. The method according to claim 14, further comprising focusing a lens of the camera on a front-end face of the contact part, the front-end face facing away from the electrical line.

16. The method according to claim 15, further comprising performing a height position correction to the alignment gripper when an actual height position of the contact part deviates from a predetermined reference height position, wherein the actual height position is defined as an axial position in relation to the rotation axis of the front-end face of the contact part.

17. The method according to claim 14, wherein the actual rotational position of the contact part is determined as the alignment gripper rotates the contact part about the rotation axis.

* * * * *